(12) United States Patent
Hiroi

(10) Patent No.: US 7,663,240 B2
(45) Date of Patent: Feb. 16, 2010

(54) SEMICONDUCTOR DEVICE WITH MULTIPLE INTERCONNECT LAYERS AND VIAS

(75) Inventor: Masayuki Hiroi, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 349 days.

(21) Appl. No.: 11/329,045

(22) Filed: Jan. 11, 2006

(65) Prior Publication Data

US 2006/0170108 A1  Aug. 3, 2006

(30) Foreign Application Priority Data

Jan. 28, 2005 (JP) .............................. 2005-020820

(51) Int. Cl.
*H01L 23/52* (2006.01)
(52) U.S. Cl. ................... 257/758; 257/760; 257/775; 438/622; 438/626; 438/638
(58) Field of Classification Search ......... 257/758–760, 257/773–775; 438/622, 624, 626, 637, 638, 438/666, 668, 672, 926
See application file for complete search history.

(56) References Cited

U.S. PATENT DOCUMENTS

2003/0025191 A1* 2/2003 Takeoka et al. ............. 257/700
2004/0084777 A1* 5/2004 Yamanoue et al. .......... 257/758
2004/0150070 A1* 8/2004 Okada et al. ................ 257/508
2004/0195586 A1* 10/2004 Suzuki ....................... 257/197

FOREIGN PATENT DOCUMENTS

| JP | 2001-274338 | 10/2001 |
| JP | 2004-134450 | 4/2004 |
| JP | 2004-296843 | 10/2004 |
| JP | 2004-297022 | 10/2004 |
| JP | 2004-304124 | 10/2004 |

OTHER PUBLICATIONS

Japanese Patent Office issued a Japanese Office Action dated Oct. 6, 2009, Application No. 2005-020820.

* cited by examiner

*Primary Examiner*—Lynne A. Gurley
*Assistant Examiner*—Vernon P Webb
(74) *Attorney, Agent, or Firm*—Young & Thompson

(57) ABSTRACT

Mechanical strength and moisture resistance of a multilayer interconnect structure is to be improved. A semiconductor device includes a circuit region and a seal ring region formed around the circuit region, on a semiconductor substrate. The seal ring region includes a plurality of interconnect layers including interconnect lines and a plurality of via layers including a plurality of slit vias stacked on one another, and a pitch between the slit vias in at least one of the via layers (lower or middle layer) is different from a pitch between the slit vias in other via layers (upper layer).

20 Claims, 9 Drawing Sheets

UPPERMOST LAYER 164 (VIA)
162 (INTERCONNECT)

UPPER LAYER 160 (VIA)
158 (INTERCONNECT)

MIDDLE LAYER 156 (VIA)
154 (INTERCONNECT)

LOWER LAYER 152 (VIA)
150 (INTERCONNECT)

SEMICONDUCTOR DEVICE WITH MULTIPLE INTERCONNECT LAYERS AND VIAS

This application is based on Japanese patent application No. 2005-020820, the content of which is incorporated hereinto by reference.

BACKGROUND

1. Technical Field

The present invention relates to a semiconductor device that includes a multilayer interconnect structure.

2. Related Art

To cope with the recent growing demand for higher operating speed for semiconductor chips, various studies are being aggressively made on employing a material having a lower dielectric constant to form an interlayer dielectric in place of a silicon oxide film (dielectric constant K=approx. 4.3), to thereby reduce parasitic capacitance between interconnect lines. Examples of applicable low dielectric constant (hereinafter abbreviated as low-k) insulating material include HSQ, MSQ, and aromatic-containing organic resins, which have a dielectric constant of approx. 3. Besides, for achieving a still lower dielectric constant, porous materials that include minute pores are lately being developed. Employing such low-k materials to form the interlayer dielectric allows reducing crosstalk between the interconnect lines, thus achieving higher operating speed of the chips.

The low-k films, however, generally have low film strength, and insufficient adhesion properties. Besides, because of the lack of strength, the low-k film is prone to be scraped off during a CMP (Chemical Mechanical Polishing) process, in a region where interconnect lines are not densely distributed.

Now, when fabricating semiconductor chips, a plurality of circuit chips are first formed on a wafer, and then the wafer is diced into individual chips. By the dicing process, dicing sections of the semiconductor chips are exposed. Accordingly, a seal ring region is provided along the periphery of each circuit chip, so as to prevent intrusion of water or moisture through the dicing sections. JP-A 2004-297022 discloses a structure of a semiconductor chip provided with a seal ring constituted of vias and interconnects disposed along the outer periphery. In this structure, the seal ring is continuously disposed so as to be connected to all layers, including the lower layers and upper layers of the semiconductor chip, to thereby prevent the intrusion of water or moisture through the dicing sections (FIG. 2 of JP-A 2004-297022).

Generally, in a semiconductor device, upper layers are formed in an insulating layer constituted of silicon oxide film, which is sufficiently rigid, serving as the interlayer dielectric, while lower layers are formed in an interlayer dielectric constituted of a low-k film, for reducing the interconnect capacitance. The low-k film lacks in mechanical strength and adhesion properties, as stated above. Besides, the low-k film is prone to absorb moisture. Therefore, improvement in mechanical strength and moisture resistance with respect to the lower layers of the semiconductor device is an important issue to be addressed.

On the other hand, since the upper layers include the wider interconnects and the larger vias in general, the size of the seal ring region is determined according to the size of the interconnects and vias in the upper layers. Therefore, it is desirable to have the interconnects and vias in the upper layers disposed so as to prevent the seal ring region from excessively expanding.

SUMMARY OF THE INVENTION

According to the present invention, there is provided a semiconductor device including: a circuit region formed on a semiconductor substrate; and a seal ring region formed around the circuit region; the seal ring region including a plurality of interconnect layers each having interconnect lines formed in an interlayer dielectric and a plurality of via layers each having a plurality of slit vias formed in an interlayer dielectric stacked on one another and a pitch between the slit vias in at least one of the via layers being different from a pitch between the slit vias in other via layers.

The term "via pitch" herein means an average of an interval between the center of a via and that of the adjacent via in the respective layers.

Depending on the material employed as the interlayer dielectric, for example, the via pitch may be made narrower when a material less resistant to moisture is employed, and the via pitch may be made wider when a material more resistant to moisture is employed. Such arrangement allows enhancing the effect of the seal ring in a via layer formed in an interlayer dielectric constituted of a material less resistant to moisture. Also, the via pitch may be made narrower when the via is wide, and wider when the via is narrow. Such configuration allows restricting the area of the region allocated to the seal ring region within a certain limit, thus saving the space for the chip forming region.

In the semiconductor device according to the present invention, the via pitch in at least one of the via layers may be made narrower than the via pitch in at least another via layer provided in an upper layer with respect thereto.

When locating the slit vias and interconnects so as to constitute the seal ring, it is preferable to form the slit vias and interconnects in the seal ring region in compliance with the design rule (via width/diameter or thickness, or interconnect width/thickness) applied to the vias and interconnects in the circuit region of the respective same layers. This is because, since the slit vias and interconnects in the seal ring region are simultaneously formed with the vias and interconnects in the circuit region of the same layer, in the case where the sizes of the slit vias and interconnects in the seal ring region are largely different from the sizes of the vias and interconnects in the circuit region of the same layer, the film thickness may result uneven when filling the via holes and interconnect trenches with a metal layer, and a CMP (Chemical Mechanical Polishing) process may incur uneven film thickness or pattern dishing. In the circuit region, a finer pattern is formed in a lower layer, than in an upper layer. In the seal ring region too, accordingly, a finer pattern is formed in the lower layer than in the upper layer.

FIG. 9 is a cross-sectional view showing a seal ring formed in a chip that includes narrower interconnects and vias in a lower layer than in an upper layer. Here, the chip includes interlayer dielectrics 1, interconnects 3. In such structure wherein the interconnects and vias are the narrower in the lower layers, forming the seal ring so as to be continuously connected to the respective lower and upper layers at a constant pitch results in a less metal content in the lower layers. The lower metal content leads to degradation in mechanical strength of the layer and in adhesion with the upper and lower adjacent layers. Besides, as already stated, the semiconductor devices generally include the low-k film as the interlayer dielectric in lower layers, and hence an impact of the dicing and application of heat cycles often incurs delamination at the interface of the low-k film, because of the lack of strength and adhesion performance of the film. Further, intrusion of moisture is also incurred. Such problems become more serious when a porous film is employed as the low-k film. According to the present invention, forming the slit via in a narrower via pitch in a lower layer allows increasing the mechanical strength, adhesion, and moisture resistance of the lower layer. Likewise, the interconnect may be formed in a narrower interconnect pitch in a lower layer. This leads to an increase in the mechanical strength, adhesion, and moisture resistance of the lower layer. The term "interconnect pitch" herein means an average of an interval between the center of an interconnect and that of the adjacent interconnect in the respective layers.

Further, since the upper layer includes the wider interconnects and the larger vias, the size of the seal ring region is determined according to the size of the interconnects and vias in the upper layers. According to the present invention, however, the seal ring size in the upper layers is maintained within a certain limit, thereby allowing to appropriately introduce the interconnects and slit vias in a dead space in the lower layer. Therefore, the foregoing advantages can be obtained without increasing the size of the seal ring region.

The interconnects and slit vias in the seal ring region can be simultaneously formed with the interconnects and vias in the circuit region. Therefore, the desired interconnects and slit vias can be formed in the seal ring region without setting an additional manufacturing step.

The semiconductor device of the present invention may further include an interlayer dielectric constituted of a porous film in at least one of the interconnect layers and the via layers; and a barrier insulating layer having a higher moisture resistance than the interlayer dielectric constituted of a porous film provided thereon throughout the circuit region and the seal ring region.

The present invention enables increasing the mechanical strength and moisture resistance of a multilayer interconnect structure.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The present invention will be now described herein with reference to illustrative embodiments. Those skilled in the art will recognize that many alternative embodiments can be accomplished using the teachings of the present invention and that the invention is not limited to the embodiments illustrated for explanatory purposed.

Hereunder, embodiments of the present invention will be described referring to the accompanying drawings. Throughout the drawings, similar constituents are given identical numerals, and description thereof will appropriately be omitted.

Figure 1:
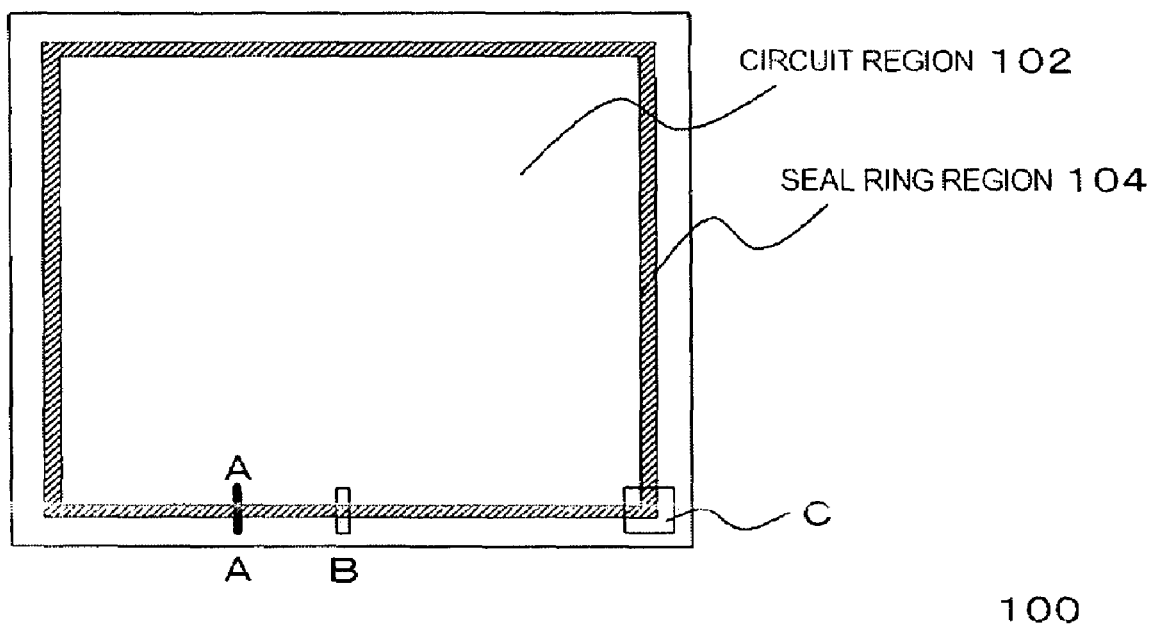
FIG. 1 is a plan view showing a semiconductor device according to an embodiment of the present invention.

FIG. 1 is a plan view showing a semiconductor device according to an embodiment of the present invention.

FIG. 1 represents a chip forming region in one of a plurality of circuit chips formed on a semiconductor wafer. Each chip forming region of a semiconductor device 100 includes a circuit region 102 and a seal ring region 104 surrounding the circuit region 102. The circuit region 102 includes an inner circuitry.

First Embodiment

Figure 2:
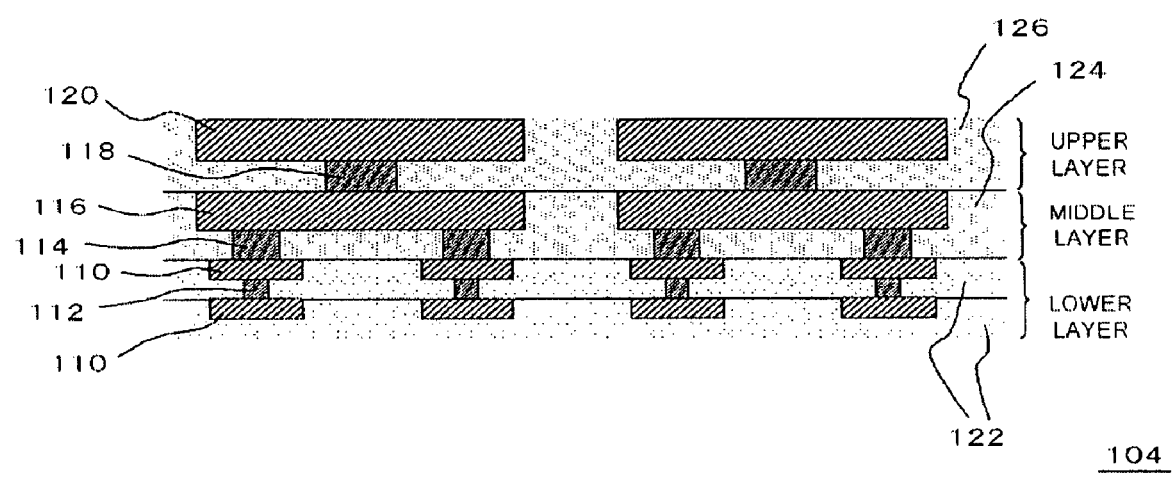
FIG. 2 is a cross-sectional view taken along the line A-A of FIG. 1, showing details of a seal ring region.

FIG. 2 is a cross-sectional view taken along the line A-A of FIG. 1, showing details of the seal ring region 104 according to this embodiment.

The seal ring region 104 includes a plurality of interconnect layers including interconnect lines and a plurality of via layers including vias, alternately stacked. The seal ring region 104 includes two layers of lower-layer interlayer dielectric 122, a middle-layer interlayer dielectric 124 formed thereon, and an upper-layer interlayer dielectric 126 formed thereon. The two layers of lower-layer interlayer dielectric 122 respectively include a lower-layer interconnect 110, a lower-layer slit via 112, and a lower-layer interconnect 110 formed in this sequence. The middle-layer interlayer dielectric 124 includes an middle-layer slit via 114 and an middle-layer interconnect 116 formed in this sequence. Likewise, the upper-layer interlayer dielectric 126 includes an upper-layer slit via 118 and an upper-layer interconnect 120 formed in this sequence.

In this embodiment, the via pitch in the seal ring region 104 is made narrower in the lower layer than in the upper layer. Likewise, the interconnect pitch in the seal ring region 104 is also made narrower in the lower layer than in the upper layer. Here, the "via pitch" means an average of the interval between the center of a via and that of the adjacent via in the respective layers. Accordingly, the interconnect pitch means an average of an interval between the center of an interconnect and that of the adjacent interconnect in the respective layers.

Further, the via width in the seal ring region 104 is narrower in the lower layer than in the upper layer, in terms of the average. Similarly, the interconnect width in the seal ring region 104 is narrower in the lower layer than in the upper layer, in terms of the average. In this embodiment, all the interconnects and vias do not have to be thus formed, but the via width and interconnect width have only to be narrower in a general view, in the lower layer than in the upper layer.

In the example shown in FIG. 2, for example, the via pitch of the lower-layer slit via 112 and that of the middle-layer slit via 114 are narrower than the via pitch of the upper-layer slit via 118. Also, the via width increases in order of the lower-layer slit via 112, the middle-layer slit via 114, and the upper-layer slit via 118. Also, the interconnect pitch of the lower-layer interconnect 110 is narrower than that of the middle-layer interconnect 116 and the upper-layer interconnect 120. Further, the width of the lower-layer interconnect 110 is narrower than those of the middle layer interconnect 116 and the upper-layer interconnect 120.

In this embodiment, the interlayer dielectric, especially the lower-layer interlayer dielectric 122 may be constituted of a low-k film. More specifically, a material having a dielectric constant not exceeding 3.3 for example may be employed as the low-k film. Examples of such low-k film include SiOC, a polyorgano-siloxane such as HSQ (hydrogen silsesquioxane), MSQ (methylsilsesquioxane), or MHSQ (methyl-hydrogen silcesquioxane), an aromatic-containing organic resin such as polyallylether (PAE), divinylsiloxane-bis-benzociclobutene (BCB) or Silk (registered trademark), SOG (spin on glass), FOX (flowable oxide) and so forth. Also, the low-k film may be constituted of a porous material. Employing a porous material allows further reducing the dielectric constant of the interlayer dielectric. Such low-k film is prone to incur degradation in mechanical strength, moisture resistance and adhesion properties, when employed as the interlayer dielectric. In this embodiment, however, increasing the content of a metal material in the lower layer in which the low-k film is employed as the interlayer dielectric allows restraining the degradation in mechanical strength, moisture resistance and adhesion properties.

For example, in the interconnect layer constituted of a porous dielectric film, in the via layers provided on and under this interconnect layer, in the via layer constituted of a porous dielectric film, or in the interconnect layers provided on and under this via layer, the interconnect pitch or slit via pitch may be made narrower, while the interconnects or slit vias may be made wider than in other layers, and a greater number of interconnects or slit vias may be provided than in other layers.

In this embodiment, the interconnects and vias may be constituted of a material containing copper. The interconnects and vias may be formed through a single Damascene or a dual Damascene process.

In this embodiment, the vias and interconnects in the circuit region 102 of the semiconductor device 100 are formed in compliance with the design rule prescribing a finer structure in a lower layer. The slit vias and interconnects in the seal ring region 104 are simultaneously formed with the vias and interconnects in the circuit region 102, and hence the slit vias and interconnects in the seal ring region 104 also have a finer structure in a lower layer. Accordingly, when the same number of slit vias and interconnects are provided in the lower layer as in the upper layers, the slit vias and interconnects in the lower layer contain a smaller amount of metal material. This results in a lower binding performance by the metal material, and hence in degraded adhesion. In this embodiment, however, a greater number of slit vias and interconnects are provided in the lower layer than in the upper layer. This secures a sufficient metal content in the lower layer.

Also, the slit vias and interconnects in the respective layers are formed so as to make the seal ring region 104 generally uniform in width throughout all the layers. The width of the seal ring region 104 herein means an interval between an inner edge of an innermost slit via or interconnect and an outer edge of an outermost slit via or interconnect. As a specific example, the slit vias and interconnects in the respective layers are formed such that the width of the seal ring region 104 in one of the layers does not exceed ±30% with respect to other layers. Such configuration allows restricting an increase in area of the seal ring region 104 in the upper layers, thereby suppressing an increase in size of the semiconductor device 100.

In this embodiment, increasing metal content in the lower layer can cause the metal material to serve as a wedge, so as to prevent interlayer delamination. Increasing the metal content is also effective in maintaining the mechanical strength of the interlayer dielectric, and further enhance the moisture resistance of the semiconductor device 100 with the seal ring, without increasing the size of the semiconductor device 100.

Second Embodiment

This embodiment is different from the first embodiment in that the lower layer of the semiconductor device 100 includes an interconnect or a via that is not connected to an interconnect or a via in the adjacent upper layer.

Figure 3:
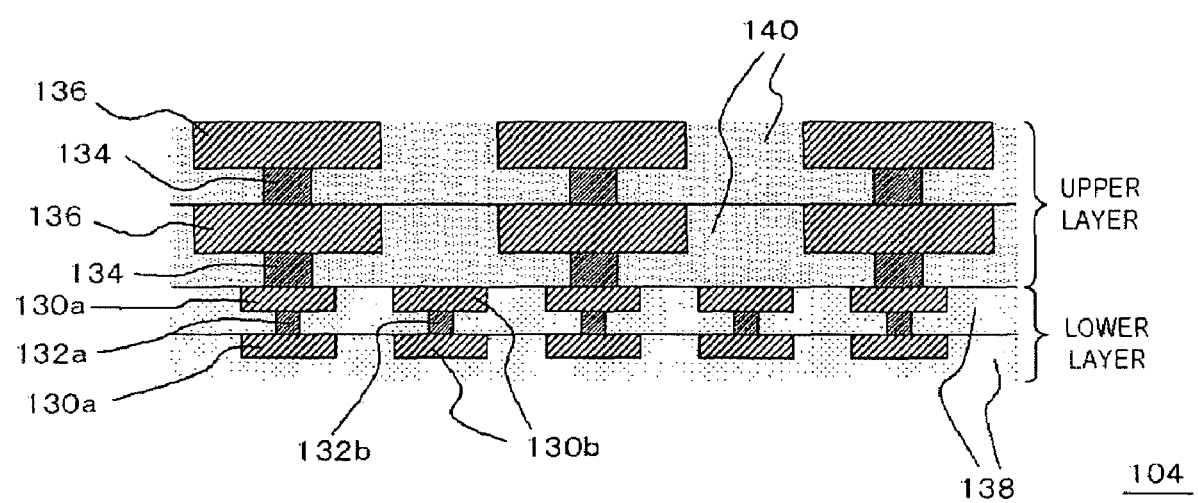
FIG. 3 is a cross-sectional view taken along the line A-A of FIG. 1, showing details of the seal ring region.

FIG. 3 is a cross-sectional view taken along the line A-A of FIG. 1, showing details of the seal ring region according to this embodiment.

The seal ring region 104 includes two layers of lower-layer interlayer dielectric 138, and two layers of upper-layer interlayer dielectric 140. The two layers of lower-layer interlayer dielectric 138 includes a first lower-layer interconnect 130a and a second lower-layer interconnect 130b, a first lower-layer slit via 132a and a second lower-layer slit via 132b, and a first lower-layer interconnect 130a and a second lower-layer interconnect 130b formed in this sequence. The two layers of upper-layer interlayer dielectric 140 includes an upper-layer slit via 134, an upper-layer interconnect 136, an upper-layer slit via 134, and an upper-layer interconnect 136 formed in this sequence.

In this structure, the via pitch between the first lower-layer slit via 132a and the second lower-layer slit via 132b is narrower than that between the upper-layer slit vias 134. Also, the via width of the first lower-layer interconnect 130a and the second lower-layer interconnect 130b is narrower than that of the upper-layer slit via 134. The interconnect pitch between the first lower-layer interconnect 130a and the second lower-layer interconnect 130b is narrower than that between the upper-layer interconnects 136. Likewise, the interconnect width of the first lower-layer interconnect 130a and the second lower-layer interconnect 130b is narrower that that of the upper-layer interconnect 136.

Further, the via width in the seal ring region 104 is narrower in the lower layer than in the upper layer, in terms of the average. Similarly, the interconnect width in the seal ring region 104 is narrower in the lower layer than in the upper layer, in terms of the average. In this embodiment, all the interconnects and vias do not have to be thus formed, but the via width and interconnect width have only to be narrower in a general view, in the lower layer than in the upper layer.

In this embodiment, the first lower-layer interconnect 130a and the first lower-layer slit via 132a are connected to the upper-layer slit via 134 and the upper-layer interconnect 136 in the upper layer, while the second lower-layer slit via 132b and the second lower-layer interconnect 130b are not connected to the via and interconnect in the upper-layer. Providing thus, in the lower-layer interlayer dielectric 138, the second lower-layer interconnect 130b unconnected to the upper-layer slit via 134 in the adjacent upper layer allows dispersing a stress imposed on the via and interconnect, and increasing the thermal stress resistance.

Figure 4:
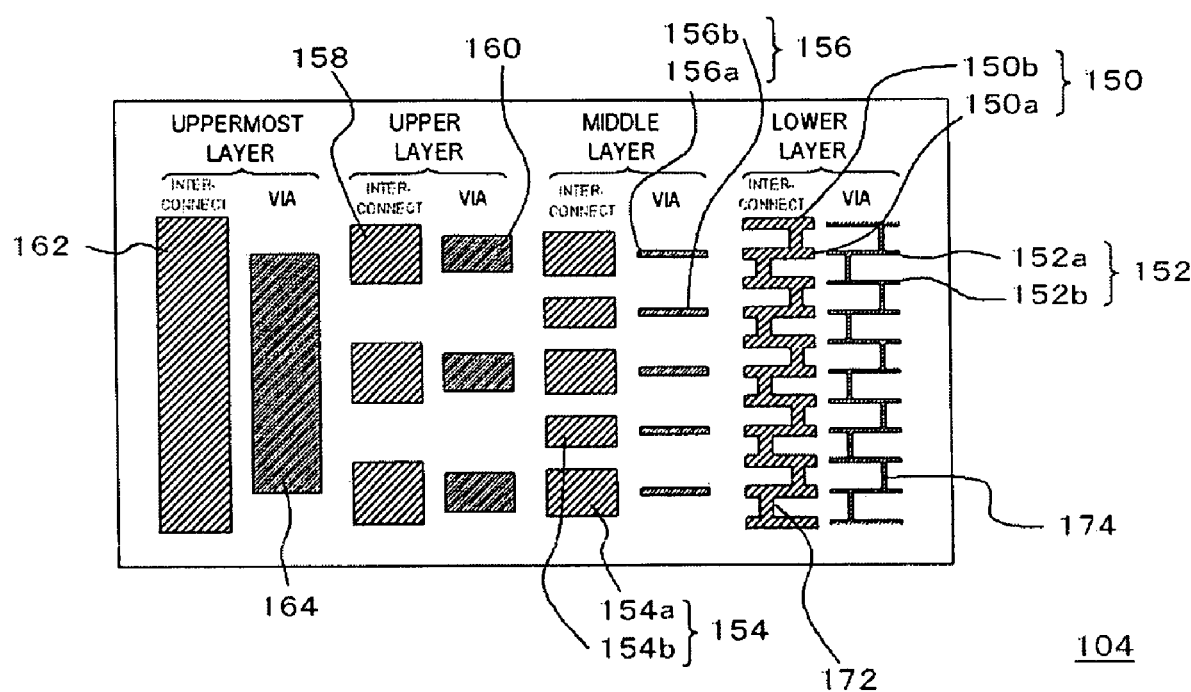
FIG. 4 is a plan view showing interconnect and via patterns of the respective layers in a region enclosed by solid lines B in FIG. 1.

FIG. 4 is a plan view showing the interconnect and via patterns of the respective layers in a region enclosed by solid lines B in FIG. 1. To be more detailed, FIG. 4 shows the interconnect and via patterns formed in an uppermost layer, an upper layer, a middle layer and a lower layer respectively.

The lower layer includes lower-layer slit vias 152 (first lower-layer slit vias 152a and second lower-layer slit vias 152b) and lower-layer interconnects 150 (first lower-layer interconnects 150a and second lower-layer interconnects 150b). The middle layer includes middle-layer slit vias 156 (first middle-layer slit vias 156a and second middle-layer slit vias 156b) and middle-layer interconnects 154 (first middle-layer interconnects 154*a* and second middle-layer interconnects 154*b*). The upper layer includes upper-layer slit vias 160 and upper-layer interconnects 158. The uppermost layer includes an uppermost-layer slit via 164 and an uppermost-layer interconnect 162.

The via width increases in order of the lower-layer slit via 152, the middle-layer slit via 156, the upper-layer slit via 160, and the uppermost-layer slit via 164. Likewise, the interconnect width increases in order of the lower-layer interconnect 150, the middle-layer interconnect 154, the upper-layer interconnect 158, and the uppermost-layer interconnect 162.

Here, the lower-layer slit via 152, the middle-layer slit via 156, the upper-layer slit via 160 and the uppermost-layer slit via 164 are the slit vias extending along the outer periphery of the circuit region 102, as is the case with the interconnects. The lower layer includes eleven each of lower-layer slit vias 152 and lower-layer interconnects 150. The middle layer includes five each of middle-layer slit vias 156 and middle-layer interconnects 154. The upper layer includes three each of upper-layer slit vias 160 and upper-layer interconnects 158. The uppermost layer includes one each of uppermost-layer slit via 164 and uppermost-layer interconnect 162.

Increasing thus the number of vias and interconnects in a lower layer secures sufficient metal content in the lower layer. Accordingly, the metal material can serve as a wedge that prevents interlayer delamination. Increasing the metal content is also effective in maintaining the mechanical strength of the interlayer dielectric.

Also, the lower layer includes vertical slit via 174 disposed so as to generally perpendicularly extend with respect to the direction of the slit via 152 extending along the outer periphery of the circuit region 102, thus to achieve a mesh connection of the slit vias 152 and the vertical slit via 174. Likewise, the lower layer includes vertical interconnects 172 disposed so as to generally perpendicularly extend with respect to the direction of the interconnects 150 extending along the outer periphery of the circuit region 102, thus to achieve a mesh connection of the interconnects 150 and the vertical interconnects 172. Providing thus the vertical interconnects 172 and the vertical slit vias 174 allows preventing the degradation in mechanical strength, moisture resistance and adhesion properties. Further, in the semiconductor device 100 according to this embodiment, the via width and interconnect width are the narrower in the lower layers. This may lead to disconnection of the vias and interconnects in the lower layers. If a via or an interconnect is disconnected at a point, there may be a possibility that water or moisture intrude therethrough. In such the case, in the absence of the vertical interconnect 172 or vertical slit via 174 in such event, water or moisture intrudes into an entire region inside the disconnected via or interconnect. However, providing the vertical interconnect 172 and the vertical slit via 174, accordingly, allows covering a part of the inner region against the intrusion of water or moisture. Consequently, even though the slit via or interconnect is disconnected at a certain position, the mesh-shaped structure serves as a barrier against the intrusion of water or moisture, thus to protect the circuit region 102. Also, according to the design rule prescribing the finer structures in the lower layers, the porous material is more likely to be employed as the interlayer dielectric in the lower layers. Therefore, forming the finer meshes with the greater number of vias and interconnects in the lower layers further ensures the prevention of the intrusion of water or moisture.

In the middle layer, the first middle-layer interconnect 154*a* is connected to the upper-layer slit via 160 in the upper layer, while the second middle-layer interconnect 154*b* is not connected to the upper-layer slit via 160 in the upper layer. The first middle-layer slit via 156*a* is connected to the first middle-layer interconnect 154*a*, and the second middle-layer slit via 156*b* to the second middle-layer interconnect 154*b*, respectively. Likewise, in the lower layer, the first lower-layer interconnect 150*a* is connected to the first middle-layer slit via 156*a* and the second middle-layer slit via 156*b* in the middle layer, while the second lower-layer interconnect 150*b* is not connected to the first middle-layer slit via 156*a* and the second middle-layer slit via 156*b* in the middle layer. Such configuration allows dispersing a stress imposed on the via and interconnect, and increasing the thermal stress resistance.

FIGS. 5A to 5D are plan views showing interconnect and via patterns of the respective layers in a corner portion enclosed by solid lines C in FIG. 1.

Figure 5A:
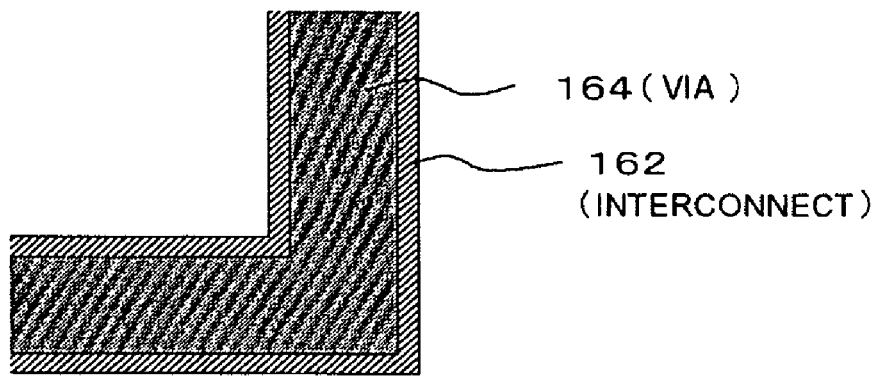
FIGS. 5A to 5D are plan views showing interconnect and via patterns of the respective layers in a region enclosed by solid lines C in FIG. 1.
Figure 5B:
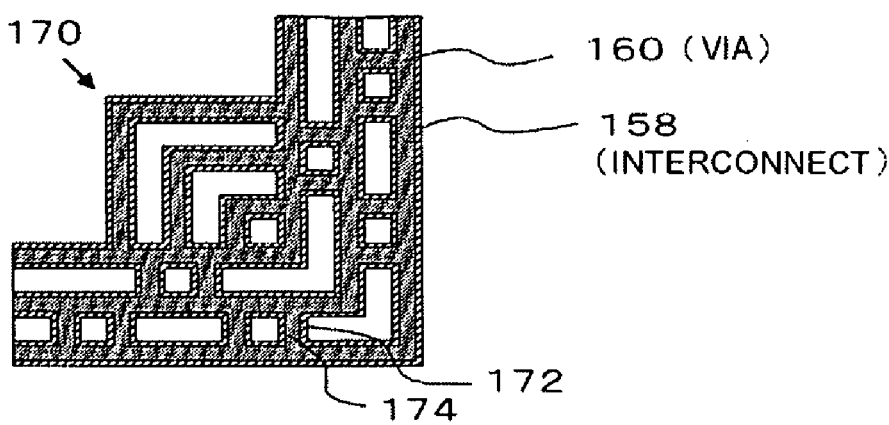
Figure 5C:
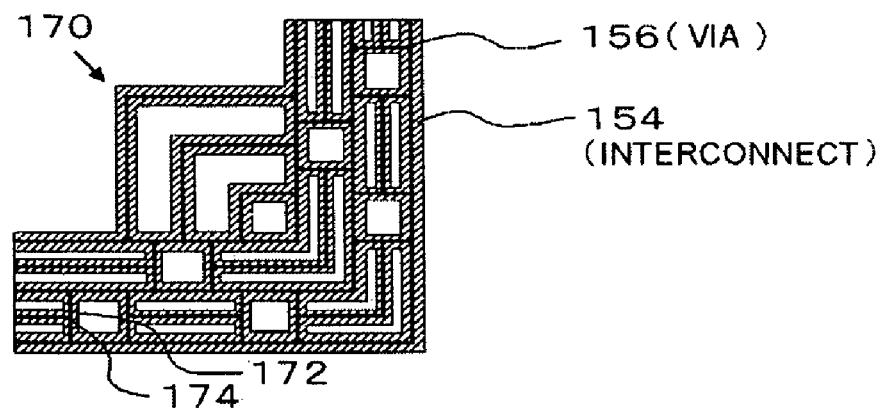
Figure 5D:
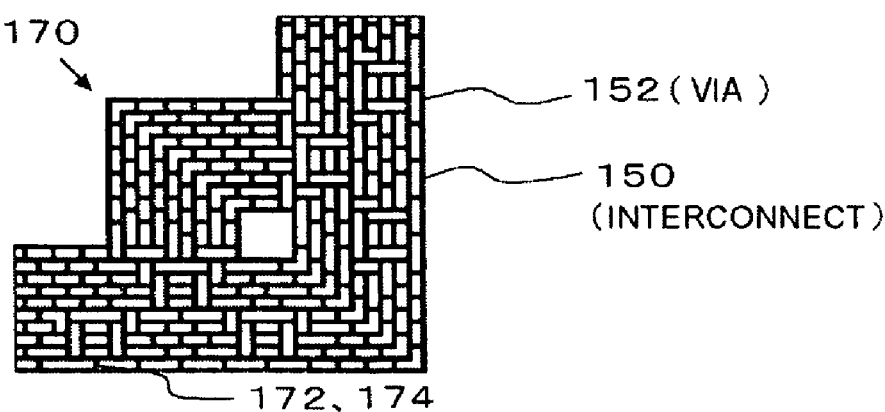

FIG. 5A shows the uppermost-layer interconnect 162 and the uppermost-layer slit via 164. FIG. 5B shows the upper-layer interconnects 158 and the upper-layer slit vias 160. FIG. 5C shows the middle-layer interconnects 154 and the middle-layer slit vias 156. FIG. 5D shows the lower-layer interconnects 150 and the lower-layer slit vias 152.

In addition, the corner portion includes a spacer seal ring 170 disposed on the side of the circuit region 102 in all the layers except the uppermost layer, so as to connect a side of the seal ring and the adjacent side thereof. Providing thus the spacer seal ring 170 at the corner portion of the seal ring increases the crack resistance at the corner portion. To repeat, employing a low-k film as the interlayer dielectric leads to degradation in mechanical strength, moisture resistance and adhesion properties. In this embodiment, however, providing the spacer seal ring 170 in the seal ring in the lower layer where a low-k film is employed as the interlayer dielectric allows preventing the degradation in mechanical strength, moisture resistance and adhesion properties.

Further, at the corner portion, the vertical interconnects 172 and the vertical slit vias 174 are provided in all the layers except the uppermost layer. Such configuration allows preventing the degradation in mechanical strength, moisture resistance and adhesion properties. Also, providing the vertical interconnects 172 and the vertical slit vias 174 allows covering a part of the inner region against the intrusion of water or moisture.

In this embodiment, the interconnects and vias extending in one direction are disposed so as not to intersect with other interconnects and vias extending in a direction generally perpendicular thereto. In other words, in this embodiment the interconnect and vias extending in one direction are connected to other interconnects and vias extending in a direction generally perpendicular thereto, so as to form a T-shape in a plan view at the connection point.

Figure 6A:
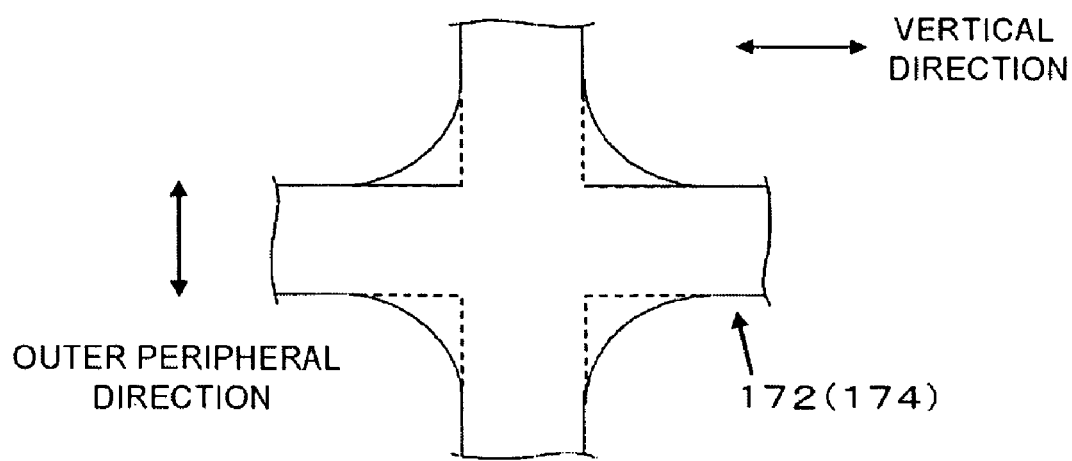
FIGS. 6A and 6B are enlarged drawings showing the vias or interconnects disposed in a cross-intersection and in a T-shape connection respectively.
Figure 6B:
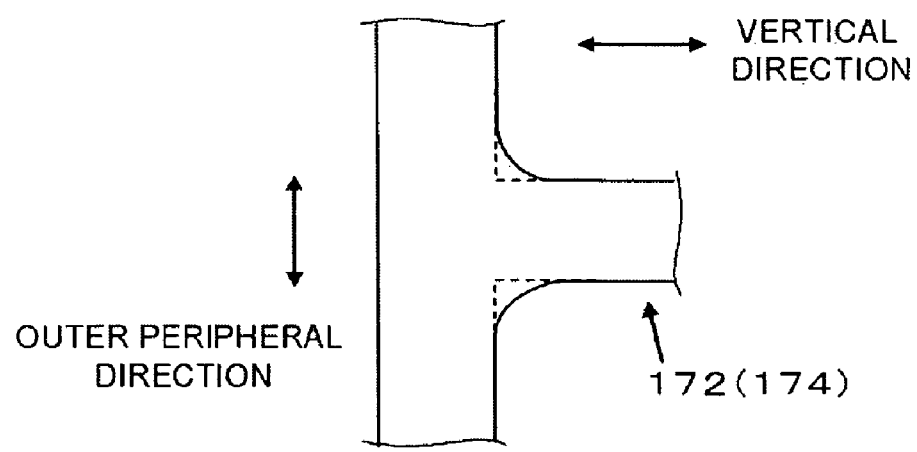

FIGS. 6A and 6B are enlarged drawings showing the vias or interconnects disposed in a cross-intersection and in a T-shape connection respectively.

As shown in FIG. 6A, in the case where the vias or interconnects are disposed in a cross-intersection, the via hole or interconnect trench is excessively etched at the intersection during the etching process to form the vias or interconnects, and the pattern is expanded. Since the via pattern and the interconnect pattern are very fine especially in the lower layers of the semiconductor device 100, such expansion is more prone to take place. Such expansion requires a greater amount of metal material to fill that portion with, when filling the via holes or interconnect trenches, than other portions. If the intersection portion is not completely filled with the metal material, the portion loses planarity, and may subsequently incur distortion that provokes the intrusion of water or moisture through the seal ring.

In contrast, in the case where the vias or interconnects are connected in a T-shape as shown in FIG. 6B, even though the via hole or interconnect trench is expanded at the corners of the connection point upon performing the etching, the unevenness in thickness of the metal material that fills the via hole or interconnect trench can be reduced, because of the fewer number of expanded portions. Such configuration, therefore, prevents distortion in the finished products, thus ensuring the performance by the seal ring as expected. Preferably, for similar reasons, a plurality of T-shaped connection points may be located with a certain interval among one another. In addition, provided that a region is securely protected from the intrusion of water or moisture into the circuit region 102 through the seal ring, for example an inner region enclosed by the T-shaped connection points, the cross-intersection of the vias or interconnects may be formed, within a certain limitation in the number of such intersections.

This embodiment also achieves the similar advantageous effects to those of the first embodiment.

Third Embodiment

This embodiment is different from the second embodiment in that a barrier insulating layer is provided on the lower layer.

Figure 7A:
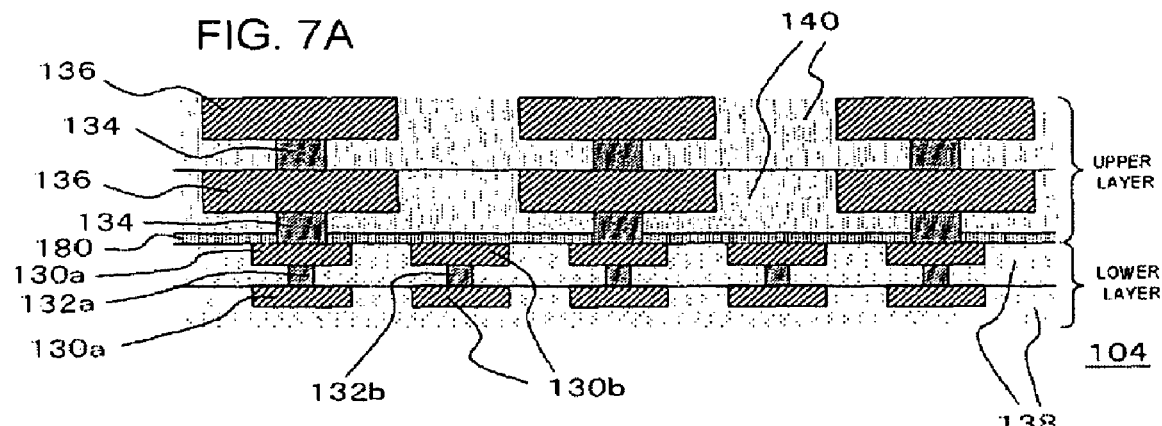
FIGS. 7A, 7B and 7C are cross-sectional views taken along the line A-A of FIG. 1, showing details of the seal ring region.
Figure 7B:
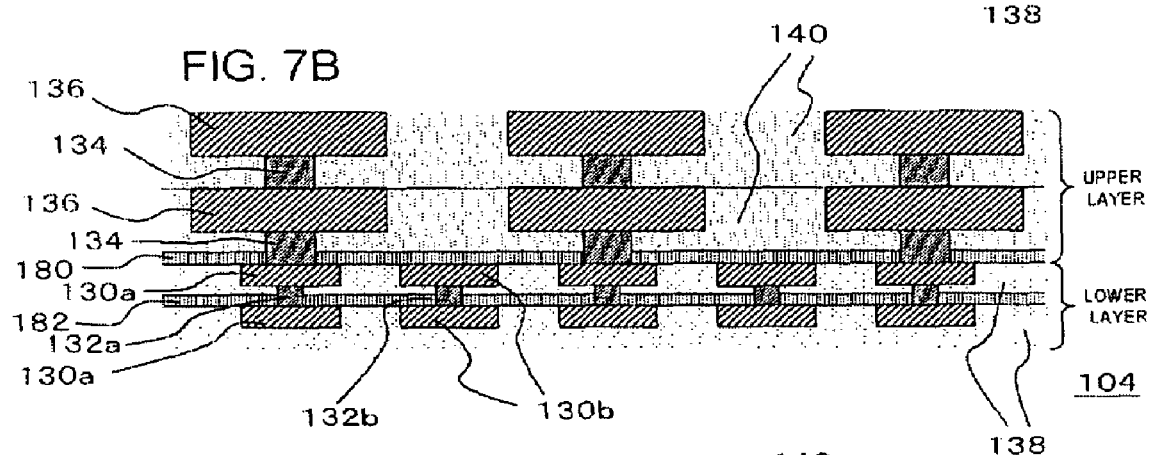
Figure 7C:
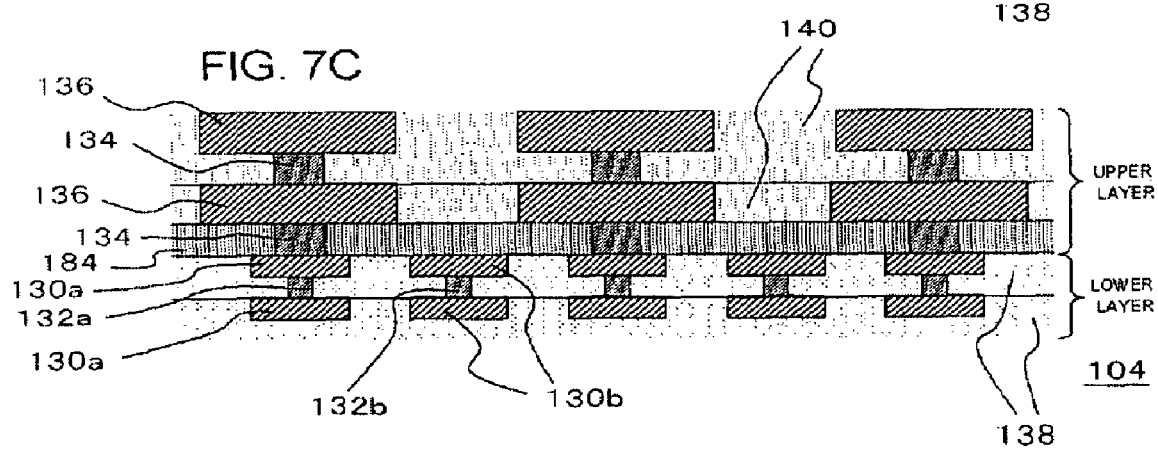

FIGS. 7A, 7B and 7C are cross-sectional views taken along the line A-A of FIG. 1, showing details of the seal ring region according to this embodiment.

The example shown in FIG. 7A includes, in addition to the structure of the seal ring region 104 shown in FIG. 3, a barrier insulating layer 180 disposed between the lower layer and the upper layer, so as to restrict the intrusion of water or moisture. The barrier insulating layer 180 is provided not only in the seal ring region 104, but throughout the entire chip including the circuit region 102. The barrier insulating layer 180 may be constituted of a material more resistant to moisture than a material of the lower-layer interlayer dielectric 138. The barrier insulating layer 180 may be constituted of SICN, SiC, SiN, SIOC, SION (all of those may also contain hydrogen) or the like. The barrier insulating layer 180 may also be constituted of a modified layer subjected to a modifying process for increasing the moisture resistance or rigidity. In the case where a diffusion barrier is provided between the lower-layer interlayer dielectrics 138, the barrier insulating layer 180 does not have to be provided in addition to the diffusion barrier, as the diffusion barrier can also serve as the barrier insulating layer 180. In the case where metal caps are provided only on the metal material in the interconnects or vias, however, the barrier insulating layer 180 may be formed over the metal caps.

The barrier insulating layer 180 may be provided on any desired layer, however it is preferable to provide the barrier insulating layer 180 on an interlayer dielectric constituted of a low-k film.

Such configuration prevents the intrusion of water or moisture from a lateral direction of the chip forming region with the interconnects and vias in the seal ring region 104, and the intrusion thereof from an upper direction with the barrier insulating layer 180.

FIG. 7B shows a structure including the barrier insulating layer 180 and another barrier insulating layer 182 on the two lower-layer interlayer dielectrics 138 in the lower layer, respectively. FIG. 7C shows a structure in which the entire layer that includes the upper-layer slit via 134 is constituted of a barrier insulating layer 184.

Figure 8A:
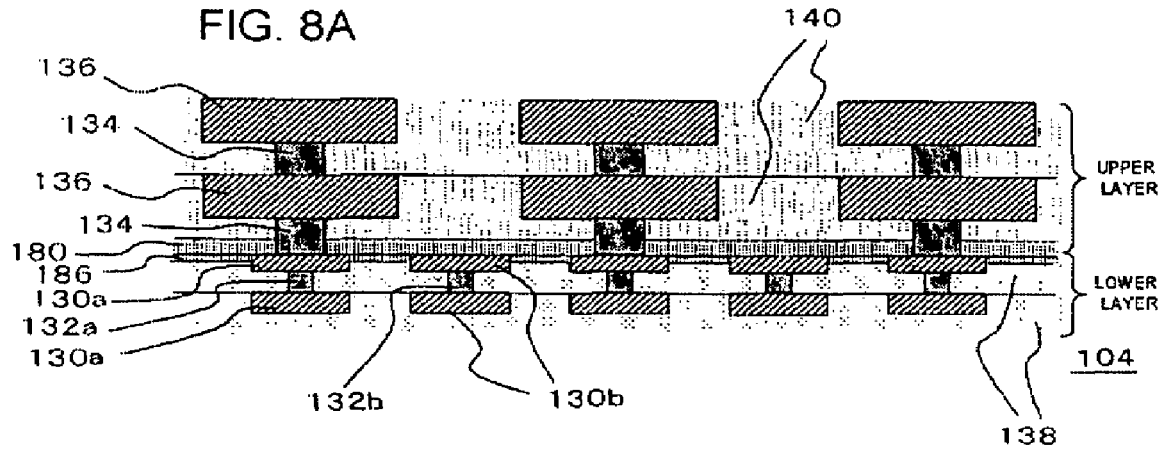
FIGS. 8A to 8C are cross-sectional views taken along the line A-A of FIG. 1, showing details of the seal ring region.
Figure 8B:
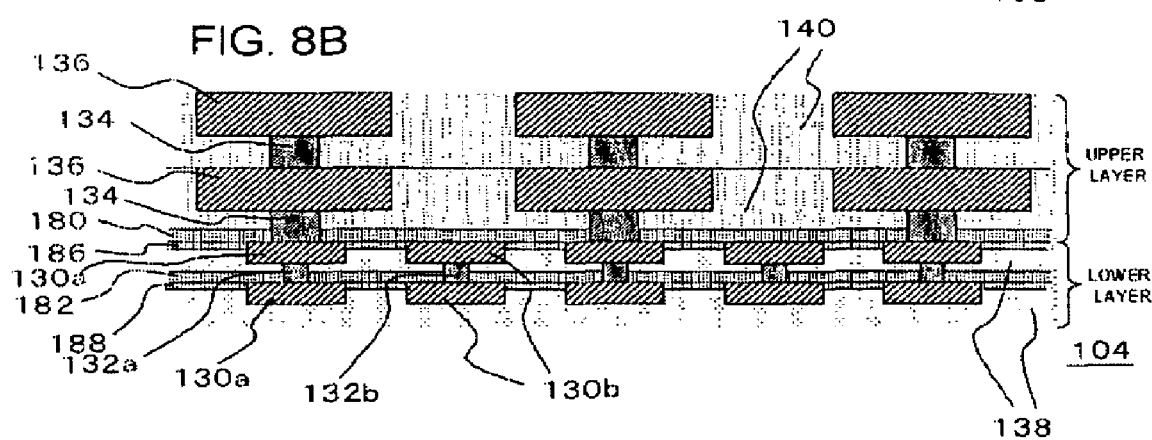
Figure 8C:
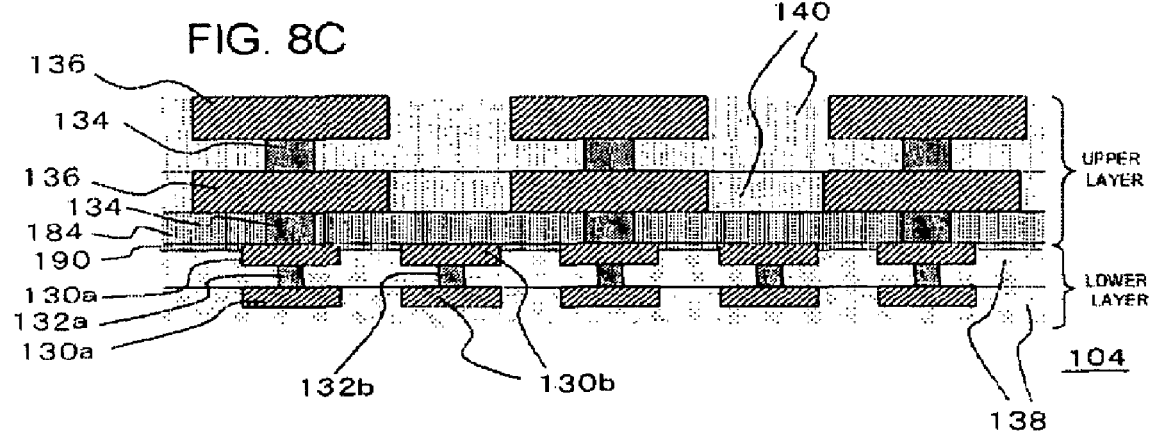
Figure 9:
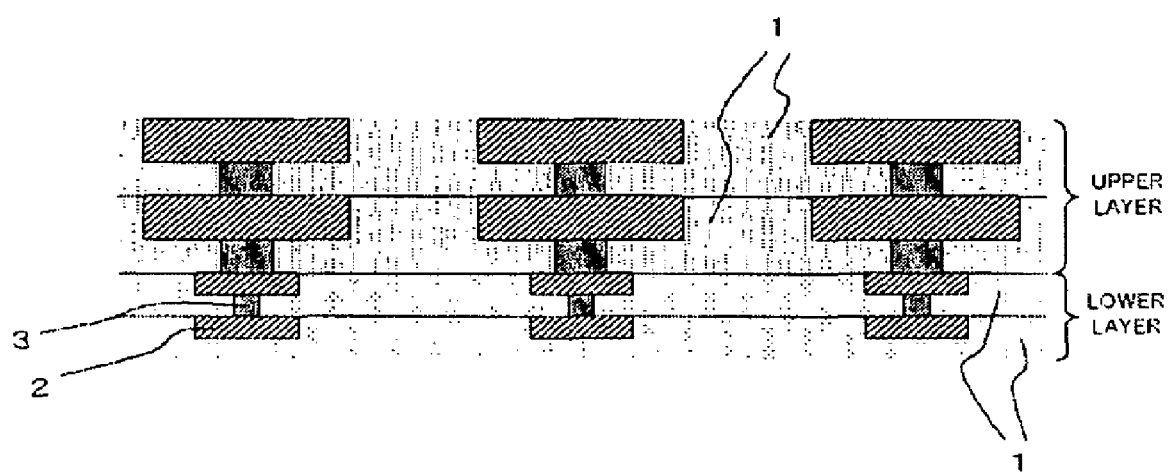
FIG. 9 is a cross-sectional view showing a seal ring of a chip in which the interconnects and vias are narrower in the lower layer than in the upper layer.

FIGS. 8A to 8C are cross-sectional views taken along the line A-A of FIG. 1, showing details of the seal ring region according to this embodiment. Structures shown therein are different from those of FIGS. 7A, 7B and 7C in that the barrier insulating layer is also provided in the layers that include the interconnect layers.

The structure shown in FIG. 8A includes a barrier insulating layer 186 and the barrier insulating layer 180 provided on the topmost lower-layer interlayer dielectric 138. The structure shown in FIG. 8B includes a barrier insulating layer 188 and a barrier insulating layer 182 provided on the lower one of the lower-layer interlayer dielectric 138, and the barrier insulating layer 186 and the barrier insulating layer 180 on the upper one of the lower-layer interlayer dielectric 138. The structure shown in FIG. 8C includes a barrier insulating layer 190 provided on the topmost lower-layer interlayer dielectric 138, and the barrier insulating layer 184 constituting the entire layer that includes the upper-layer slit via 134.

The barrier insulating layers 180, 182, 184, 186, 188, and 190 may be either constituted of a same material, or of different materials. Also, the barrier insulating layer may be provided on the interlayer dielectric of the upper layer.

In addition, the semiconductor device may further include an interlayer dielectric constituted of a porous film above or below at least one of the lower-layer interlayer dielectrics 138 and the barrier insulating layer having a higher moisture resistance than the interlayer dielectric constituted of a porous film provided thereon throughout the circuit region 102 and the seal ring region 104.

Although the embodiments and examples of the present invention have been described in details referring to the drawings, it is to be understood that they are only exemplary and that various other structures may be adopted.

The spacer seal ring 170, the vertical interconnect 172 and the vertical slit via 174 referred to in the second embodiment may also be employed in the structures according to the first and the third embodiments.

Also, the upper layers of the semiconductor device 100 may include the spacer seal ring 170, the vertical interconnect 172, the vertical slit via 174 and the like as long as an increase in area of the seal ring region 104 can be avoided.

In the respective layers, the pitch of the interconnects and vias constituting the seal ring does not have to be constant. Also, a layer may include interconnects or vias of different widths. Further, the number of the slit vias and interconnects in each layer may be appropriately modified.

Further, the present invention includes a structure wherein the pitch, width or number of slit vias or interconnects varies in stages, instead of continuously, throughout all the layers of the semiconductor device 100. In a multilayer interconnect structure including for example eleven layers, the pitch, width and number of slit vias and interconnects of the lower five layers may be set to be the same, with the pitch and width of slit vias and interconnects in the upper sixth and seventh layers set to be wider (fewer in number) than in the lower five layers, and with the pitch and width of slit vias and interconnects in the upper eighth to the eleventh layers set to be wider (fewer in number) than in the sixth and seventh layers.

While the foregoing embodiments present the structures including finer interconnect pitches in lower layers than in upper layers, the interconnect pitch may be set to be the same throughout all the layers, but with the via pitch set to be narrower in the lower layers than in the upper layers. Since the via layers have a smaller metal content than the interconnect layers, the degradation in mechanical strength, moisture resistance and adhesion properties is more prone to be incurred in the via layers. However, providing the vias at a narrower pitch in the lower layer allows preventing the degradation in mechanical strength, moisture resistance and adhesion properties.

It is apparent that the present invention is not limited to the above embodiment, and may be modified and changed without departing from the scope and spirit of the invention.

What is claimed is:

1. A semiconductor device comprising:
   a circuit region formed on a semiconductor substrate; and
   a seal ring region formed around said circuit region;
   said seal ring region including a plurality of interconnect layers each having interconnect lines formed in an interlayer dielectric and a plurality of via layers each having a plurality of slit vias formed in an interlayer dielectric stacked on one another and a pitch between said slit vias in at least one of said via layers being different from a pitch between said slit vias in other via layers.

2. The semiconductor device according to claim 1,
   wherein the pitch between said slit vias in one of said via layers is narrower than the pitch between said slit vias in at least another one of said via layers provided upper with respect thereto.

3. The semiconductor device according to claim 1, wherein said interlayer dielectric of at least one of said via layers is constituted of a porous film; and the pitch between said slit vias in said via layer including said interlayer dielectric constituted of a porous film is narrower than the pitch between said slit vias in other via layers.

4. The semiconductor device according to claim 1, wherein said interlayer dielectric of at least one of said interconnect layers is constituted of a porous film; and the pitch between said slit vias in said via layer disposed in contact with said interconnect layer including said interlayer dielectric constituted of a porous film is narrower than the pitch between said slit vias in other via layers.

5. The semiconductor device according to claim 1,
   wherein the pitch between said slit vias in said via layers formed lower is narrower than the pitch between said slit vias in said via layers formed upper.

6. The semiconductor device according to claim 1, wherein said at least one of said via layers includes a greater number of slit vias than at least another one of said via layers provided upper with respect thereto.

7. The semiconductor device according to claim 1,
   wherein a via width in said at least one of said via layers is narrower than a via width in at least another one of said via layers provided upper with respect thereto.

8. The semiconductor device according to claim 1,
   wherein said at least one of said via layers includes said slit vias aligned in a plurality of rows and connected in a mesh pattern.

9. The semiconductor device according to claim 8,
   wherein the lower layer includes the greater number of regions divided in a mesh pattern by said slit vias than an upper layer.

10. The semiconductor device according to claim 1,
    wherein said plurality of interconnect layers respectively includes a plurality of interconnect lines formed in a plurality of rows; and
    an interconnect pitch in at least one of said interconnect layers is different from an interconnect pitch in other interconnect layers.

11. The semiconductor device according to claim 10,
    wherein the interconnect pitch in said at least one of said interconnect layers is narrower than the interconnect pitch in at least another one of said interconnect layers provided upper with respect thereto.

12. The semiconductor device according to claim 10,
    wherein the interconnect pitch in said interconnect layers formed lower is narrower than said interconnect pitch in said interconnect layers formed upper.

13. The semiconductor device according to claim 10,
    wherein said at least one of said interconnect layers includes a greater number of interconnect lines than at least another one of said upper interconnect layers provided upper with respect thereto.

14. The semiconductor device according to claim 10,
    wherein said interconnect width in at least one of said interconnect layers is narrower than said interconnect width in at least another one of said upper interconnect layers provided upper with respect thereto.

15. The semiconductor device according to claim 1, wherein at least one of said interconnect lines and said slit vias is not connected to said slit vias and interconnect lines formed in an adjacent upper layer thereof.

16. The semiconductor device according to claim 1,
    wherein said seal ring region includes said slit vias and said interconnect lines continuously connected throughout all of said layers and at least one of said slit vias and said interconnects that is not connected to said slit vias or said interconnect lines in an adjacent upper layer thereof.

17. The semiconductor device according to claim 1, wherein said interlayer dielectric of at least one of said via layers and said interconnect layers is constituted of a porous film, and
    the semiconductor device further comprising a barrier insulating layer having a higher moisture resistance than said interlayer dielectric constituted of a porous film provided thereon throughout said circuit region and said seal ring region.

18. The semiconductor device according to claim 1,
    wherein said interconnects and said slit vias in said seal ring region are formed in compliance with the same design rule applied to an interconnect and a via in said circuit region.

19. The semiconductor device according to claim 1,
    wherein said interconnects include a first interconnect extending along an outer periphery of said circuit region, and a second interconnect generally perpendicularly extending with respect to the direction of said first interconnect; and
    said first interconnect and said second interconnect form a connection point of a T-shape in a plan view.

20. The semiconductor device according to claim 1,
    wherein said slit vias include a first slit via extending along an outer periphery of said circuit region, and a second slit via generally perpendicularly extending with respect to the direction of said first slit via; and
    said first slit via and said second slit via form a connection point of a T-shape in a plan view.

* * * * *